United States Patent [19]
Yonemoto et al.

[11] Patent Number: 5,237,191
[45] Date of Patent: Aug. 17, 1993

[54] SOLID-STATE CHARGE-COUPLED-DEVICE IMAGER

[75] Inventors: Kazuya Yonemoto, Tokyo; Kazunori Tsukigi, Kanagawa, both of Japan

[73] Assignee: Sony Corporation, Tokyo, Japan

[21] Appl. No.: 787,643

[22] Filed: Nov. 4, 1991

[30] Foreign Application Priority Data

Nov. 27, 1990 [JP] Japan ................................. 2-324898

[51] Int. Cl.⁵ ..................... H01L 29/78; H01L 27/14; H01L 31/00
[52] U.S. Cl. .................................. 257/249; 257/229; 257/250
[58] Field of Search ................ 357/24 LR, 24, 24 M; 377/61, 62, 63; 358/213.22, 213.23; 257/215, 222, 225, 231, 232, 233, 249, 250

[56] References Cited

U.S. PATENT DOCUMENTS

| | | | |
|---|---|---|---|
| 4,364,164 | 12/1982 | Bluzer et al. | 357/24 |
| 4,589,005 | 5/1986 | Matsuda et al. | 357/24 |
| 5,040,071 | 8/1991 | Stevens | 357/24 LR |

Primary Examiner—Andrew J. James
Assistant Examiner—Ngan Van Ngo
Attorney, Agent, or Firm—Hill, Steadman & Simpson

[57] ABSTRACT

A solid-state charge-coupled-device imager has an imaging region composed of a matrix of vertically and horizontally arrayed photosensitive areas for storing signal charges depending on the intensity of applied light, and a plurality of vertical shift resisters for vertically transferring the signal charges shifted from the photosensitive areas. The signal charges from the vertical shift registers are shifted to a horizontal shift register that transfers the signal charges in a horizontal direction. The horizontal shift register comprises a plurality of charge transfer electrodes horizontally spaced at predetermined intervals. The charge transfer electrodes are inclined to the horizontal direction. The charge transfer electrodes may be inclined linearly in their entirety to the horizontal direction or may be of a chevron shape.

1 Claim, 3 Drawing Sheets

SOLID-STATE CHARGE-COUPLED-DEVICE IMAGER

BACKGROUND OF THE INVENTION

1. Field of the Invention:

The present invention relates to a solid-state charge-coupled-device (CCD) imager, and more particularly to a horizontal charge transfer system for use in such a solid-state CCD imager.

2. Description of the Prior Art:

One known solid-state imager, for example, a solid-state CCD imager of the interline charge transfer type, is shown in FIG. 1 of the accompanying drawings. In FIG. 1, the solid-state CCD imager includes an imaging region 3 that comprises a matrix of vertically and horizontally arrayed photosensitive areas 1 for storing signal charges depending on the intensity of applied light, and a plurality of vertical shift registers (vertical charge transfer areas) 2 for vertically transferring the signal charges shifted from the photosensitive areas 1. The signal charges, corresponding to all pixels in the imaging region 3, which have been photoelectrically converted by the photosensitive areas 1, are instantaneously shifted into the vertical shift registers 2 during a fraction of a vertical blanking period. The signal charges that have been shifted into the vertical shift registers 2 are then shifted, one scanning line at a time, into a horizontal shift register (horizontal charge transfer area) 4 during a fraction of a horizontal blanking period. One scanning line of signal charges thus shifted is then horizontally transferred by the horizontal shift register 4. The horizontal shift register 4 has a terminal connected to an output circuit 5 that may comprise an FDA (Floating Diffusion Amplifier) or the like. The output circuit 5 converts the transferred signal charges into a voltage, and outputs the converted voltage.

The horizontal shift register 4 is schematically shown in FIG. 2 of the accompanying drawings. As shown in FIG. 2, the horizontal shift register 4 comprises a plurality of charge transfer electrodes spaced at equal intervals or pitches p in the horizontal direction and extending perpendicularly to the horizontal direction. Each of the charge transfer electrodes has a double-layer structure comprising a charge storage gate electrode 6 composed of a second layer of polysilicon 2Poly and a charge transfer gate electrode 7 composed of a third layer of polysilicon 3Poly. The interval or pitch p corresponds to the length of one charge transfer channel of the horizontal shift register 4. A first layer of polysilicon 1Poly is indicated by the broken lines in FIG. 2. A signal charge is indicated by a solid circular dot.

There are known solid-state CCD imagers designed with a larger number of pixels for advanced television systems such as a high-definition television (HDTV) system. In such solid-state CD imagers, the charge transfer frequency of the horizontal shift register 4 is two or three times higher than that of the horizontal shift register in a conventional solid-state CCD imager for the NTSC format. With a solid-state CCD imager having two million pixels combined with a one-inch optical system, for example, the horizontal shift register 4 has a charge transfer frequency of 37 MHz, and a relatively large charge transfer channel length of 7.3 $\mu$m. The charge transfer frequency of 37 MHz can be converted as a charge transfer time of 13.5 nsec. in theory, but the actual charge transfer time ranges from 8 to 10 nsec. owing to distortions of the transfer clock signal. Theoretically, transferring the charge transfer channel length of 7.3 $\mu$m in the charge transfer time ranging from 8 to 10 nsec. is almost at the capability limitations of the device. As a result, the charge transfer efficiency of the horizontal shift register 4 is low.

OBJECTS AND SUMMARY OF THE INVENTION

It is an object of the present invention to provide a solid-state CCD imager which includes a horizontal shift register having a shortened effective transfer channel length without varying the interval or pitch between charge transfer electrodes, for an increased charge transfer efficiency.

According to the present invention, there is provided a solid-state charge-coupled-device imager comprising an imaging region composed of a matrix of vertically and horizontally arrayed photosensitive areas for storing signal charges depending on the intensity of applied light, and a plurality of vertical shift resisters for transferring the signal charges shifted from the photosensitive areas in a vertical direction, and a horizontal shift register for transferring the signal charges from the vertical shift registers in a horizontal direction, the horizontal shift register comprising a plurality of charge transfer electrodes horizontally spaced at predetermined intervals, the charge transfer electrodes being inclined to the horizontal direction.

The charge transfer electrodes may be inclined linearly in their entirety to the horizontal direction, or may be of a chevron shape.

The above and other objects, features, and advantages of the present invention will become apparent from the following description of illustrative embodiments thereof to be read in conjunction with the accompanying drawings, in which like reference numerals represent the same or similar objects.

DETAILED DESCRIPTION OF THE PREFERRED EMBODIMENTS

Figure 2:
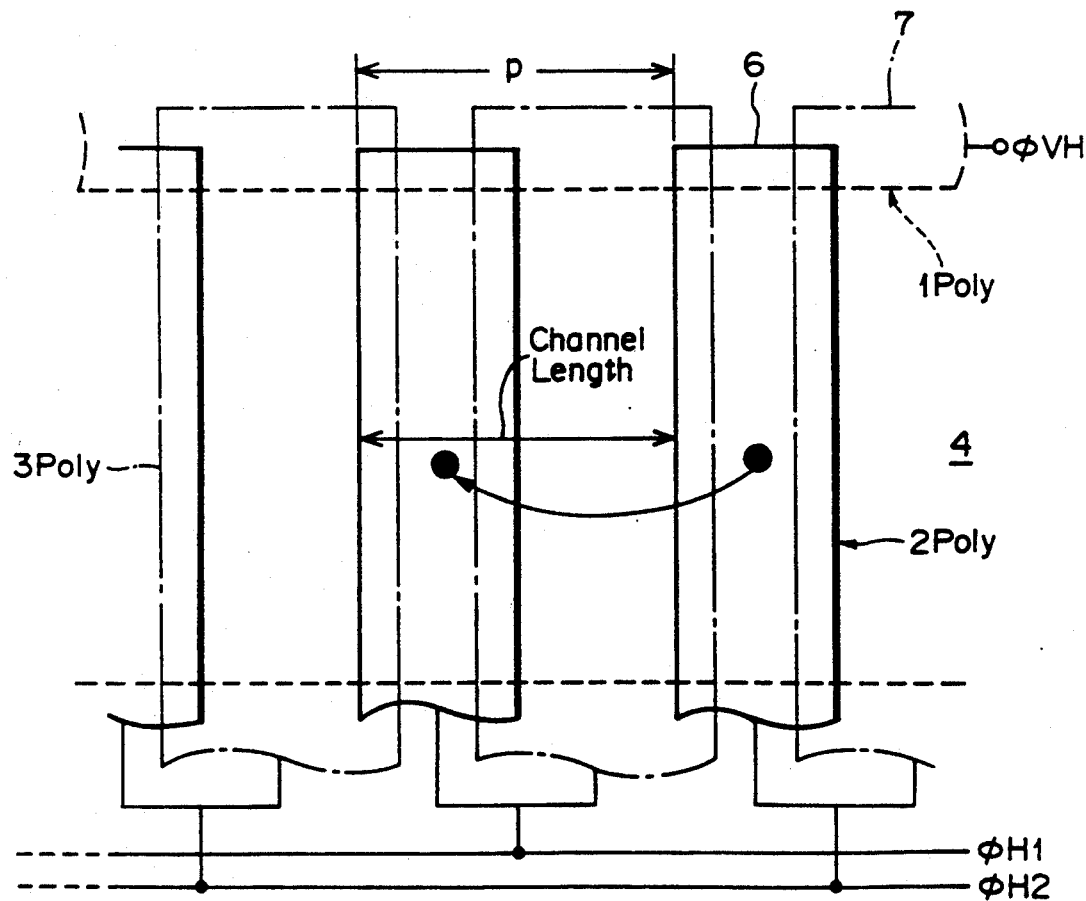
FIG. 2 is an enlarged fragmentary plan view of a conventional horizontal shift register for use in the solid-state CCD imager.
Figure 3:
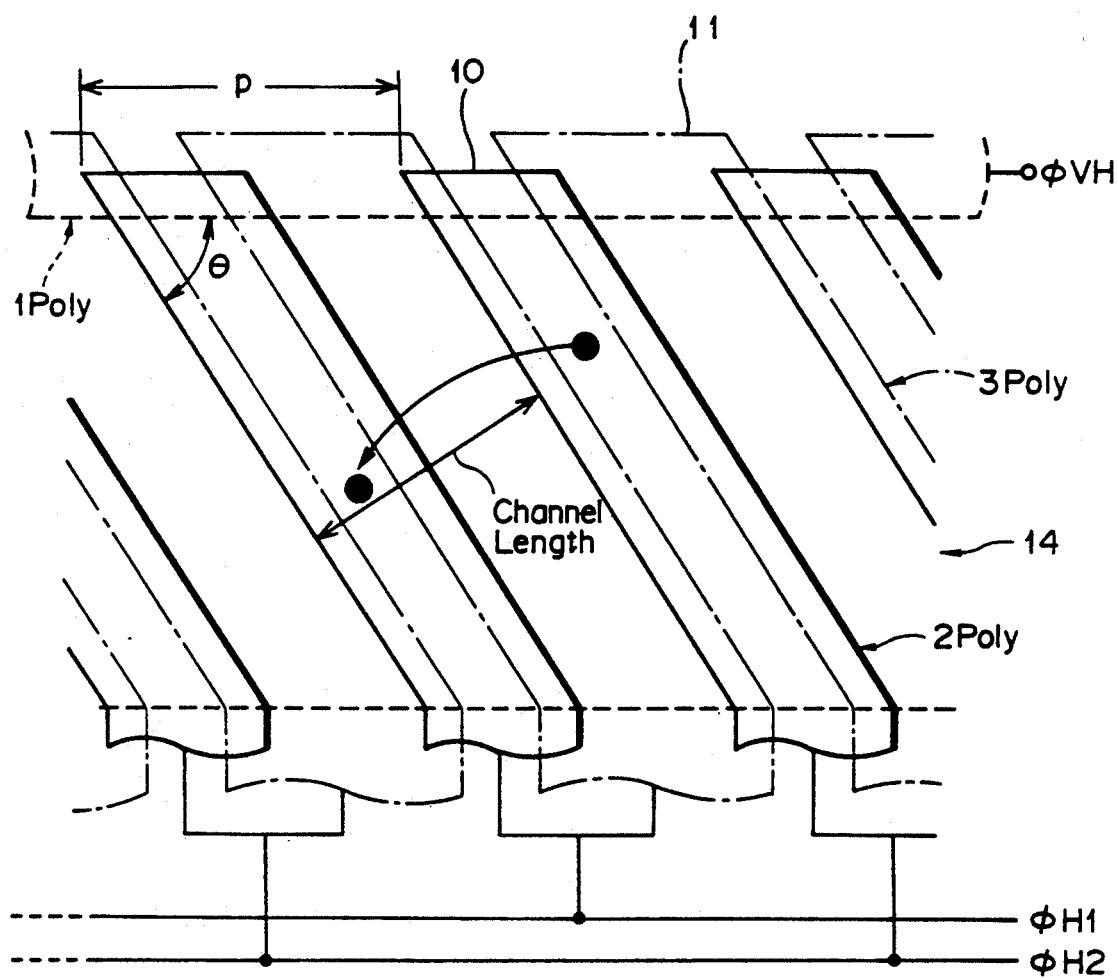
FIG. 3 is an enlarged fragmentary plan view of a horizontal shift register for use in s solid-state CCD imager according to an embodiment of the present invention.

FIG. 3 fragmentarily shows, on an enlarged scale, a horizontal shift register for use in a solid-state CCD imager according to an embodiment of the present invention. As shown in FIG. 3, the horizontal shift register, generally designated by the reference numeral 14, comprises a plurality of charge transfer electrodes spaced at equal intervals or pitches p in the horizontal direction. Each of the charge transfer electrodes has a double-layer structure comprising a charge storage gate electrode 10 composed of a second layer of polysilicon 2Poly and a charge transfer gate electrode 11 composed of a third layer of polysilicon 3Poly. The paired charge storage and transfer gate electrodes 10, 11 are inclined linearly in their entirety to the horizontal direction by an angle $\theta$. A first layer of polysilicon 1Poly is indicated by the broken lines in FIG. 3. A signal charge is indicated by a solid circular dot. The horizontal shift register 14 shown in FIG. 3 is basically of the same structure as that of the conventional horizontal shift register shown in FIG. 2, except that the electrode pattern, composed of the paired electrodes 10, 11, is inclined to the horizontal direction by the angle $\theta$.

Figure 1:
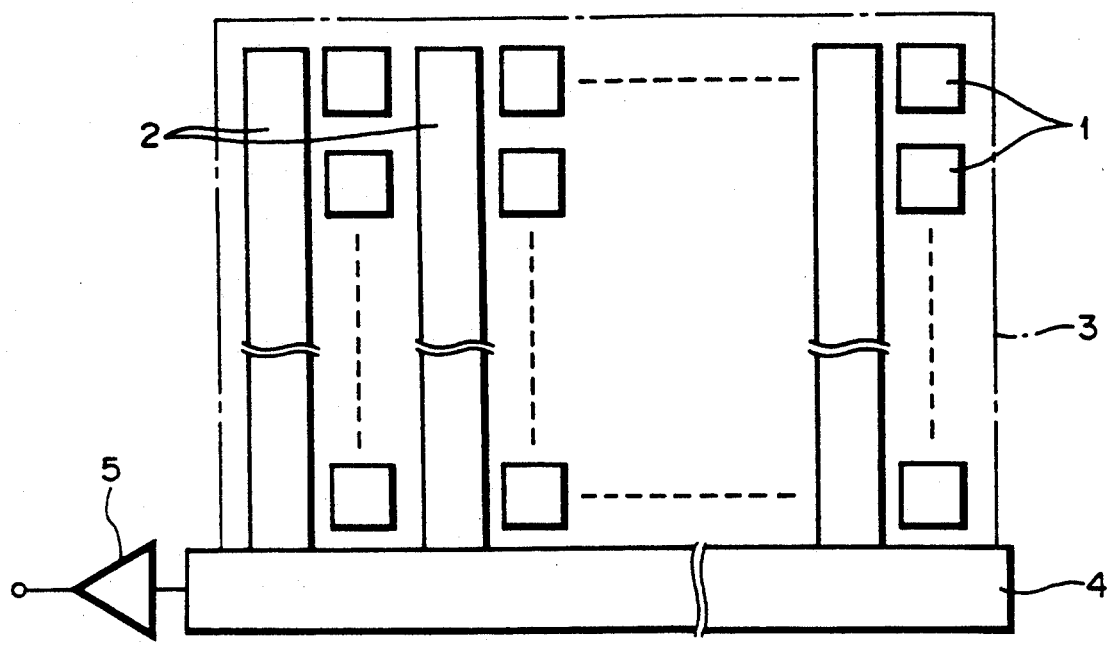
FIG. 1 is a block diagram of a solid-state CCD imager of the interline charge transfer type.

Even though the interval or pitch p between the charge transfer electrodes remain the same as those of the conventional horizontal shift register, since the electrode pattern is inclined to the horizontal direction by the angle $\theta$, the length of one effective charge transfer channel is shorter than that of one charge transfer channel in the conventional horizontal shift register in which the charge transfer electrodes extend perpendicularly to the horizontal direction. The charge transfer channel length is determined depending on the angle $\theta$ by which the electrode pattern is inclined to the horizontal direction The horizontal shift register 14 shown in FIG. 3 is combined with an imaging region which is the same as the imaging region 3 shown in FIG. 1.

Figure 4:
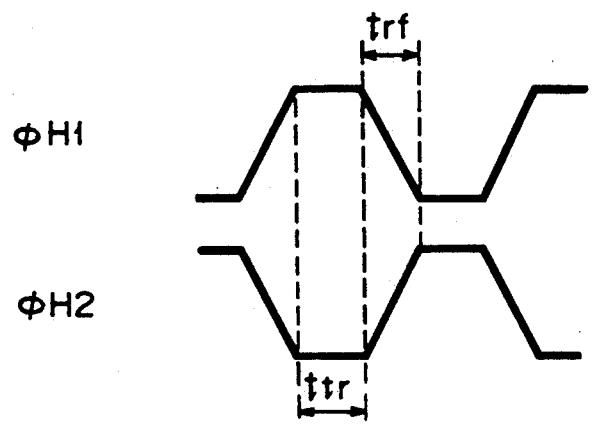
FIG. 4 is a diagram showing the waveforms of two-phase transfer clock pulses to be applied to charge transfer electrodes of the horizontal shift register shown in FIG. 3.

In operation, signal charges are shifted from the vertical shift registers 2 (see FIG. 1) of the imaging region 3 to the charge storage gate electrodes 10 of the horizontal shift register 14 shown in FIG. 3. In response to two-phase charge transfer clock pulses $\phi H1$, $\phi H2$, the signal charges thus shifted to each of the charge storage gate electrodes 10 are then transferred to an adjacent one of the charge storage gate electrodes 10 through the charge transfer gate electrode 11 therebetween in a channel that extends perpendicularly to the direction in which the electrode pattern extends. The waveforms of the two-phase charge transfer clock pulses $\phi H1$, $\phi H2$ are shown in FIG. 4. In FIG. 4, ttr represents a charge transfer time, and trf represents a time in which no charge transfer occurs.

If the charge transfer frequency of the horizontal shift register 4 is increased due to an increased number of pixels, since the time trf is governed by the performance of the clock driver, the charge transfer time ttr is shortened as its proportion in the charge transfer period is reduced. According to the present invention, as described above, the charge transfer electrode pattern is inclined to the horizontal direction by the angle $\eta$ to shorten the length of one effective charge transfer channel. Consequently, even if the charge transfer frequency of the horizontal shift register 14 is increased, the charge transfer efficiency of the horizontal shift register 14, which depends on the transfer channel length, can be increased without varying the interval or pitch p between the charge transfer electrodes.

As shown in FIG. 3, the signal charges shifted to the charge storage gate electrodes 10 for transfer between the charge transfer electrodes tend to be localized in lower portions of the charge storage gate electrodes 10. However, because the localized signal charges are averaged during the time trf in which no charge transfer occurs, the signal charges can be transferred horizontally without fail.

Figure 5:
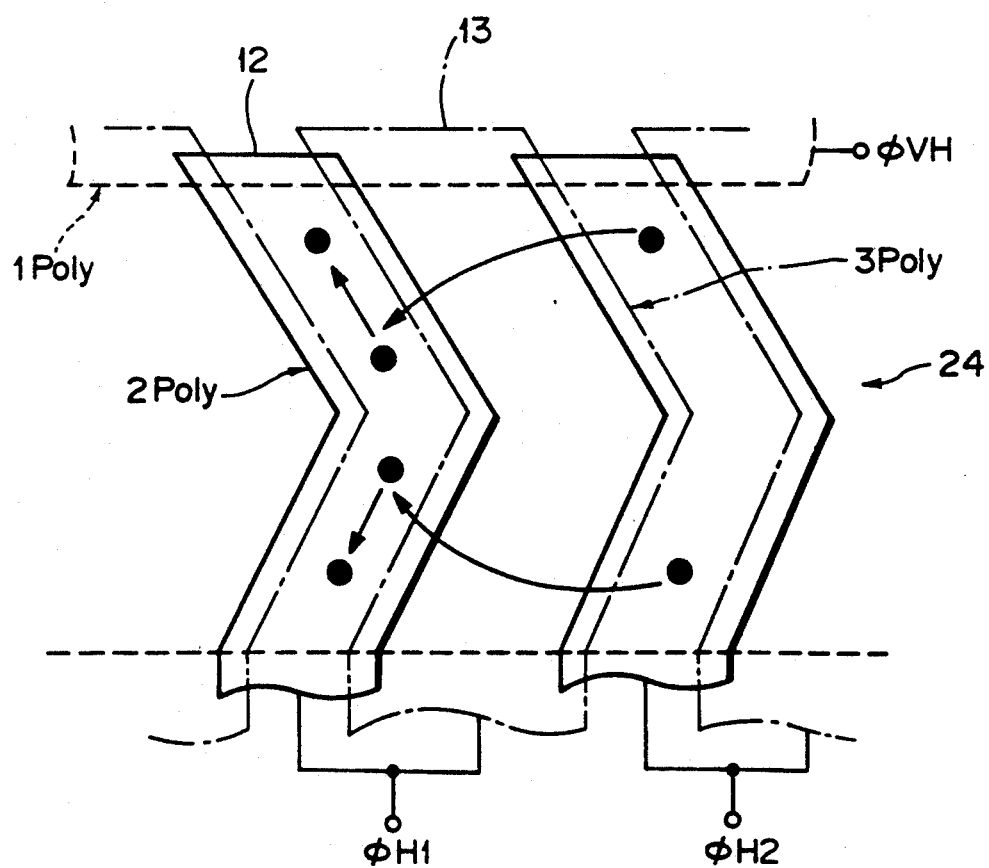
FIG. 5 is an enlarged fragmentary plan view of a horizontal shift register for use in s solid-state CCD imager according to another embodiment of the present invention.

FIG. 5 fragmentarily shows, on an enlarged scale, a horizontal shift register 24 according to another embodiment of the present invention. In the embodiment shown in FIG. 5, the horizontal shift register 24 comprises a plurality of spaced charge transfer electrodes each comprising a charge storage gate electrode 12 composed of a second layer of polysilicon 2Poly and a charge transfer gate electrode 13 composed of a third layer of polysilicon 3Poly. The electrode pattern, i.e., the paired charge storage and transfer gate electrodes 12, 13, is of a chevron shape.

Having described a preferred embodiment of the invention with reference to the accompanying drawings, it is to be understood that the invention is not limited to that precise embodiment and that various changes and modifications could be effected by one skilled in the art without departing from the spirit or scope of the invention as defined in the appended claims.

What is claimed is:

1. A charge transfer apparatus comprising:
   a plurality of storage electrodes inclined in the charge transfer direction for storing signal charges;
   a plurality of transfer electrodes lying in a common plane and inclined in the charge transfer direction for transferring the signal charges toward the charge transfer direction;
   each of said storage electrodes being electrically interconnected to a corresponding transfer electrode to form a plural set of pairs of electrodes;
   each of said electrode pair being alternately supplied with first and second clock pulses each of said first and second clock pulses having a charge transfer time and a non-charge transfer time, in which during said charge transfer time the signal charges are shifted to the storage gates and are localized under the lower portion of the respective storage gate so as to reduce the channel length; and during said non-charge transfer time the signal charges are averaged under the storage gates, and wherein said charge transfer electrodes are inclined in their entirety to said horizontal direction.

* * * * *